United States Patent [19]
Hartig et al.

[11] Patent Number: 5,364,518
[45] Date of Patent: Nov. 15, 1994

[54] MAGNETRON CATHODE FOR A ROTATING TARGET

[75] Inventors: Klaus Hartig, Brighton, Mich.; Anton Dietrich, Liechtenstein; Joachim Szczyrbowski, Goldbach, both of Germany

[73] Assignee: Leybold Aktiengesellschaft, Hanau, Germany

[21] Appl. No.: 976,960

[22] Filed: Nov. 13, 1992

Related U.S. Application Data

[63] Continuation-in-part of Ser. No. 744,280, Aug. 13, 1991, abandoned.

[30] Foreign Application Priority Data

May 28, 1991 [DE] Germany .................. 4117367

[51] Int. Cl.$^5$ ................................. C23C 14/34
[52] U.S. Cl. ................ 204/298.22; 204/192.12; 204/298.21
[58] Field of Search .......... 204/192.1, 192.12, 298.21, 204/298.22, 298.23, 298.28

[56] References Cited

U.S. PATENT DOCUMENTS

| | | | |
|---|---|---|---|
| 4,221,652 | 9/1980 | Kuriyama | 204/298.22 |
| 4,892,633 | 1/1990 | Welty | 204/298.19 X |
| 4,943,361 | 7/1990 | Kakehi et al. | 240/298.22 X |
| 5,047,131 | 9/1991 | Wolfe et al. | 204/192.23 |
| 5,069,772 | 12/1991 | Fritsche et al. | 204/298.19 X |
| 5,174,880 | 12/1992 | Bourez et al. | 204/298.19 X |

FOREIGN PATENT DOCUMENTS 217964 3/1985 German Dem. Rep. .

OTHER PUBLICATIONS

Wright et al., "Design . . . Magnetron", J. Vac. Sci. Technol. A 4(3), May/Jun. 1986, pp. 388–392.

*Primary Examiner*—Nam Nguyen
*Attorney, Agent, or Firm*—Felfe & Lynch

[57] ABSTRACT

Magnets are arranged inside a rotating tubular target to form a racetrack-shaped plasma having two straight stretches parallel to the target axis and two end stretches connecting the straight stretches. In order to achieve uniform target erosion, the magnets are arranged so that the plasma is wider and therefore less intense over the end stretches than it is over the straight stretches.

6 Claims, 4 Drawing Sheets

MAGNETRON CATHODE FOR A ROTATING TARGET

This application is a continuation-in-part of U.S. application Ser. No. 07/744,280 filed Aug. 13, 1991, now abandoned.

BACKGROUND OF THE INVENTION

The invention relates to a magnetron cathode for a rotating tubular target, wherein the plasma is in the shape of a racetrack with two long straight stretches joined together.

In a known magnetron sputtering apparatus, a target is provided as a coating on the outer cylindrical surface of a copper support tube which is mounted for rotation in a vacuum chamber. Inner and outer loops of magnets are arranged inside the support tube to form a closed tunnel of magnetic flux which serves to trap a plasma loop over the target.

FIGS. 1 and 2 illustrate such apparatus, which is also applicable for the present invention. The target 1 is applied to support tube 2 having closed ends which form a drum. Axles in the form of tubes 5, 6 are journaled for rotation in walls 3, 4 of the vacuum chamber and serve as conduits for coolant 11 whose flow is indicated by arrows 7 and 8. The drum is sealed against leakage by seals 13 and 14. A row of magnets 17 on a yoke 19 and holder 21 inside the drum serves to concentrate a plasma 12 outside the target when power is supplied to the cathode.

In FIG. 2 the magnets 17 are part of the inner loop and have a single polarity facing radially outward. The magnets 18 are part of the outer loop and have the opposite polarity facing radially outward. A racetrack shaped yoke 19 on a holder 21 serves to complete the flux path.

FIG. 2A is a schematic section of another known rotating cathode system having a single central row of magnets 16 and an outer loop 17 on a yoke 20. Once again a racetrack shaped plasma loop is entrapped by the closed loop of magnetic flux 10. A magnetron of this type is disclosed in U.S. Pat. No. 5,047,131.

FIG. 3 illustrates the racetrack shape of the plasma having straight stretches 22, 23 which parallel the axis of rotation, and end stretches or turns 24, 25. A point 26 on the rotating target 44 moves in the direction of arrow 27 through the end stretch 25, while a point 28 moves in the parallel direction 29 through the side stretches 22, 23. Since the point 26 is exposed to the active area of the plasma longer than the point 28, the target 44 forms an ablation profile 35 as shown (exaggerated) in FIG. 4. If the ring-like pits 30, 31 eroded in the surface of the target 44 reach the support tube 2 (FIG. 1), the coating of the substrate will be contaminated. If the support tube 45 is eroded through, cooling water can be released into the vacuum chamber and cause major damage.

For additional discussion of rotatable cylindrical magnetrons, see Wright et al., "Design advances and applications of the rotatable cylindrical magnetron", Journal of Vacuum Science Technology A4(3), May/June 1986, pp. 388-392.

SUMMARY OF THE INVENTION

The apparatus and methods of the present invention achieve a uniform ablation profile by altering the magnet field affecting the end stretches of the plasma loop. More particularly, the arcuate magnetic flux is widened so that the entrapped plasma is less intense and covers a wider area at the ends of the loop.

FIG. 5 is a schematic illustration of the plasma loop formed according to the invention. Note that the width 43 of the end stretches 39, 40 is considerably wider than the width of the straight stretches 41, 42. By proper adjustment of the width 43, a uniform ablation profile as illustrated in FIG. 6 may be achieved. Here the ablation profile 36 has steep flanks 37, 38 and is essentially rectangular. The target 44 is therefore consumed efficiently without premature burn-through to the underlying support tube.

The magnetic field geometry may be affected by changing the distance between magnets forming the flux arcs over the end stretches, by changing the distance between the magnet and the rotating target, or changing the number of magnets. The strength of at least one magnet may be varied by the action of an electromagnet. Other means affecting the flux geometry, and thus the plasma shape and the erosion profile of the target, include arranging a shunt on at least one magnetic pole, and affixing specially shaped pole shoes to the poles.

DETAILED DESCRIPTION OF THE PREFERRED EMBODIMENT

Figure 1:
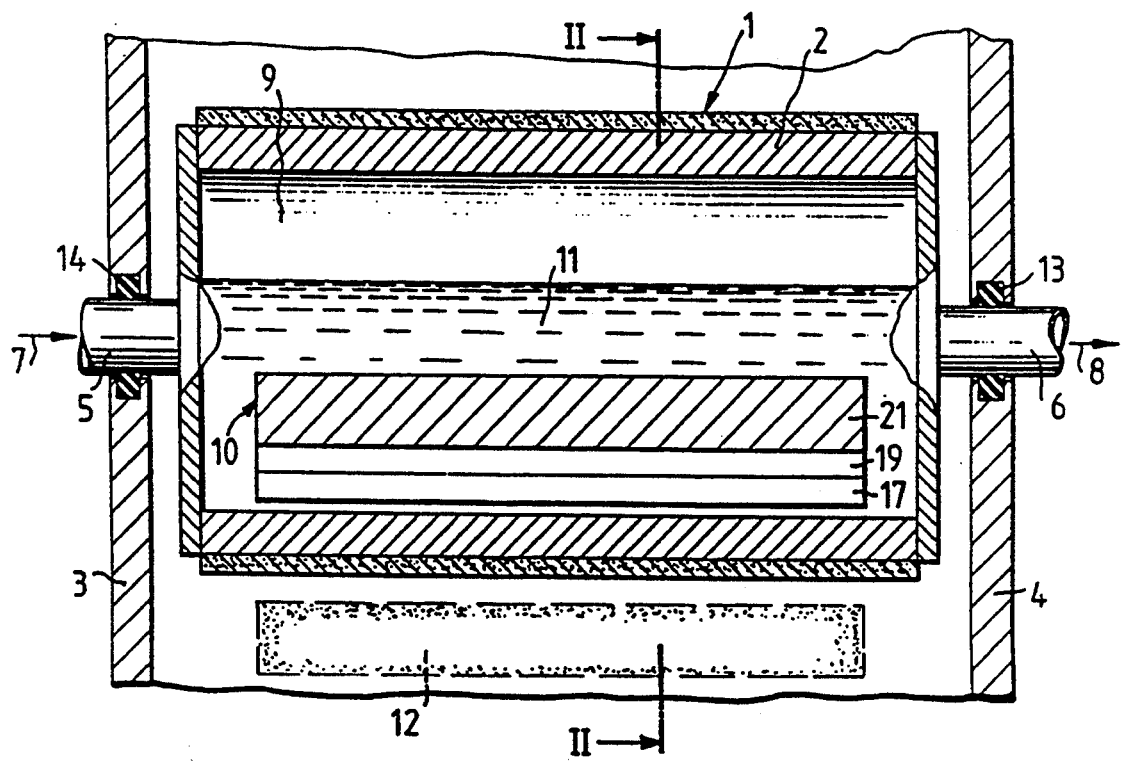
FIG. 1 is a diagrammatic cross section of a rotatable tubular cathode.
Figure 2:
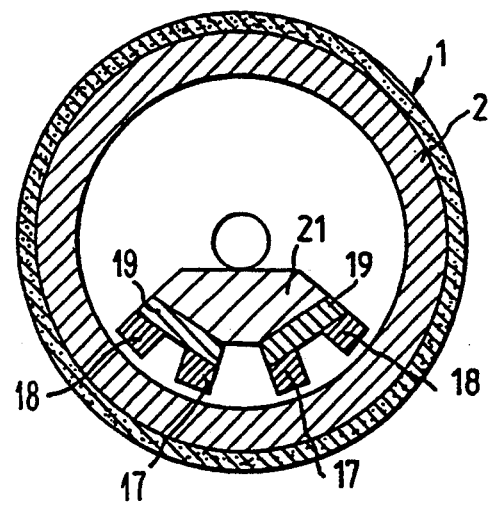
FIG. 2 is an axial cross section taken along line II—II of FIG. 1.
Figure 2A:
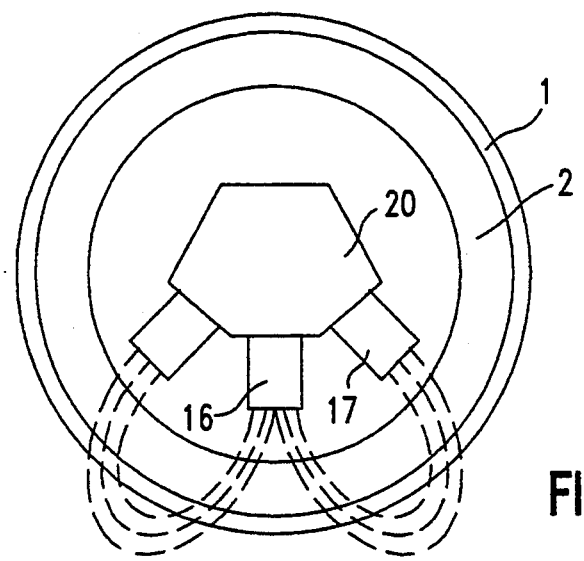
FIG. 2A is an axial cross section of an alternative embodiment of magnetron with a rotating tubular target.
Figure 3:
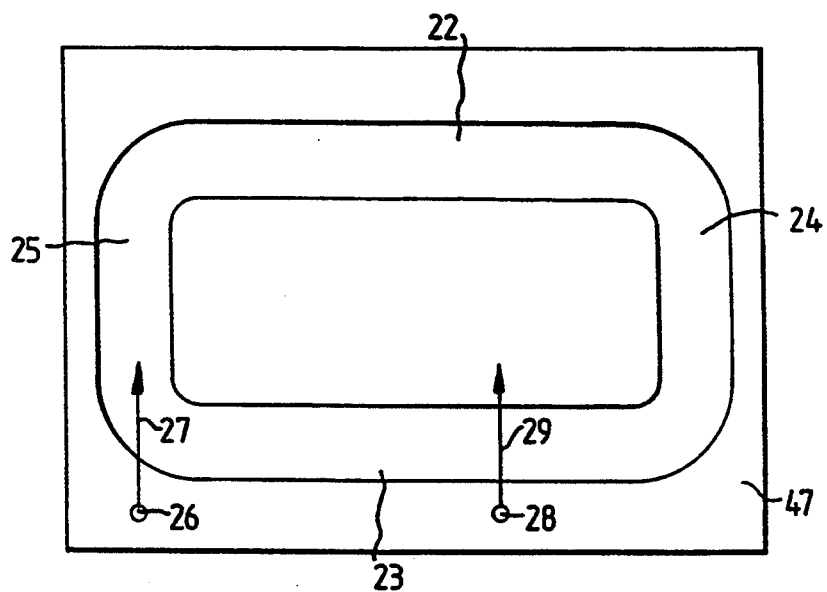
FIG. 3 is a diagrammatic plan view of the plasma formed by prior art apparatus.
Figure 4:
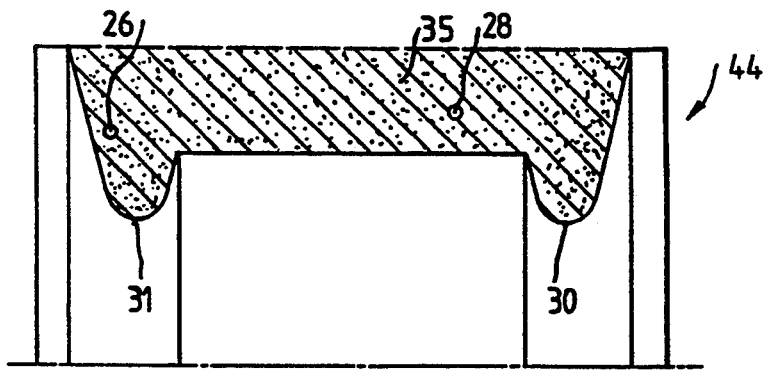
FIG. 4 is a diagrammatic partial side view of the erosion trench formed in the target with the prior art apparatus.
Figure 5:
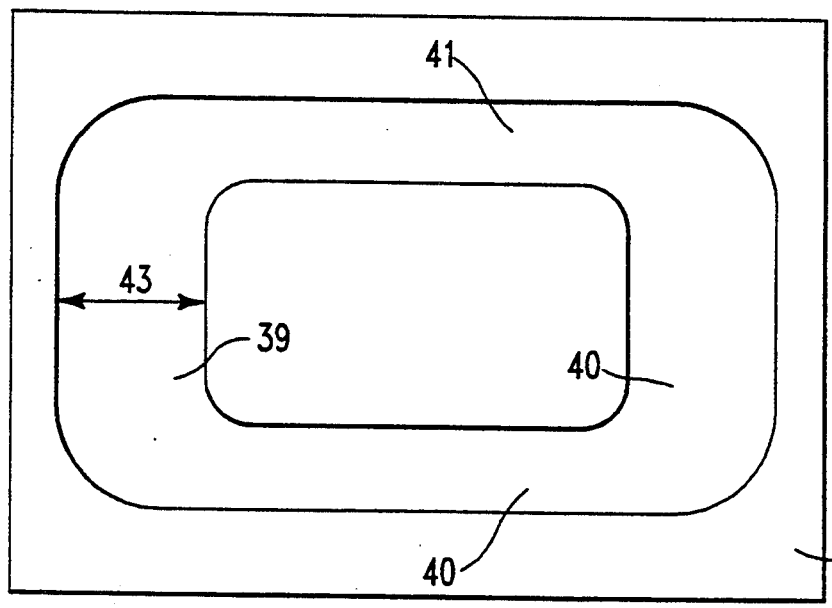
FIG. 5 is a diagrammatic plan view of the plasma formed by the inventive apparatus.
Figure 6:
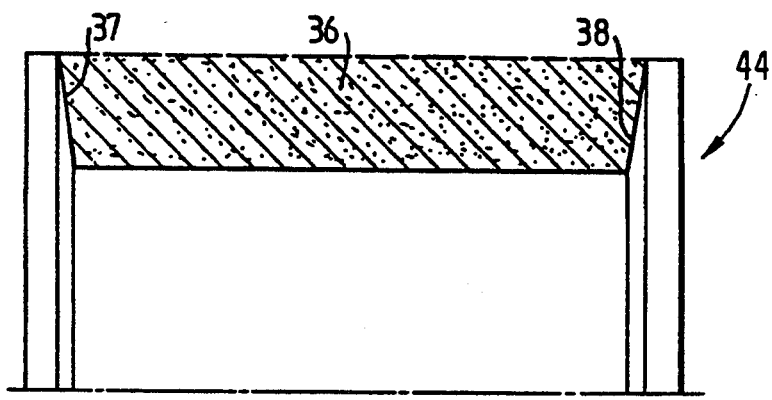
FIG. 6 is a diagrammatic partial side view of the erosion trench formed on the target with the inventive apparatus.
Figure 7:
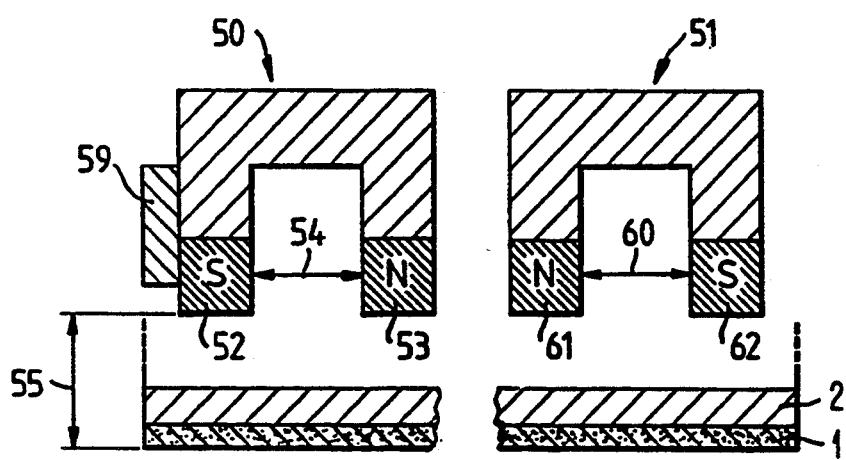
FIG. 7 is a partial side section showing the pairs of magnets over the end stretches.

FIG. 7 shows the magnet pairs 52, 53 and 61, 62 which provide the arcuate flux for the end stretches of the plasma loop. The magnets 53, 61 are part of the inner loop, while magnets 52, 62 are part of the outer loop. Yoke sections 50, 51 represent part of a single racetrack shaped yoke. Alternatively, the magnets 53, 61 may be seen as the end magnets of a single row within the outer loop (see FIG. 2A). The field geometry of the flux confining the plasma loop can be altered by varying the distances 54, 60 between magnets in each pair. More particularly, if the distances 54, 60 are greater than the spacing between magnets over the stretches parallel to the axis of rotation, without more, the plasma distribution of FIG. 5, and the erosion profile of FIG. 6, may be achieved. The actual spacing is determined experimentally.

The shape of the magnetic field may also be controlled by increasing or decreasing the distance 55 between at least one of the magnets and the target 1, or by placing a shunt 59.

Figure 7A:
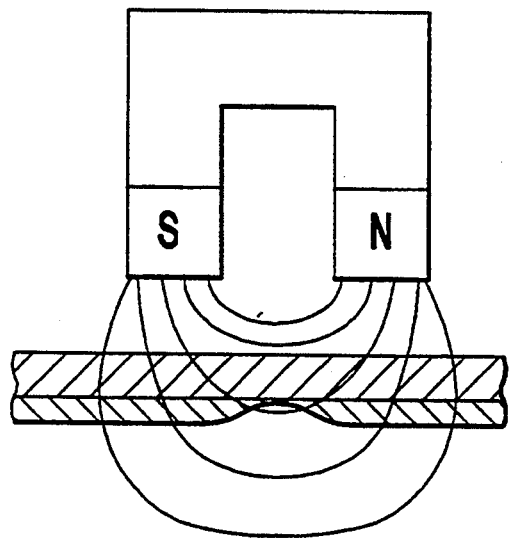
FIG. 7A is a schematic of the flux without any fixtures on the magnets.
Figure 7B:
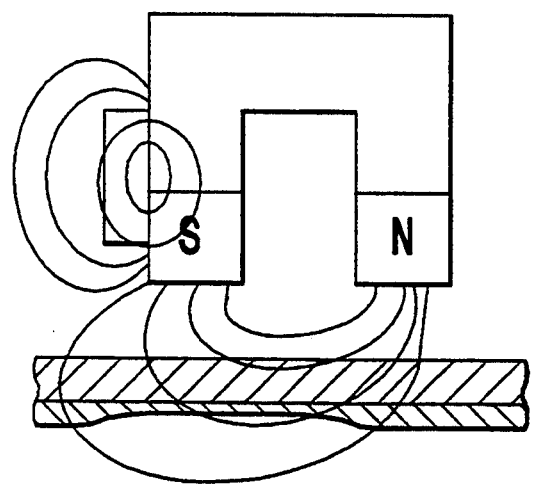
FIG. 7B is a schematic of the flux with a shunt traversing the yoke and a permanent magnet.
Figure 7C:
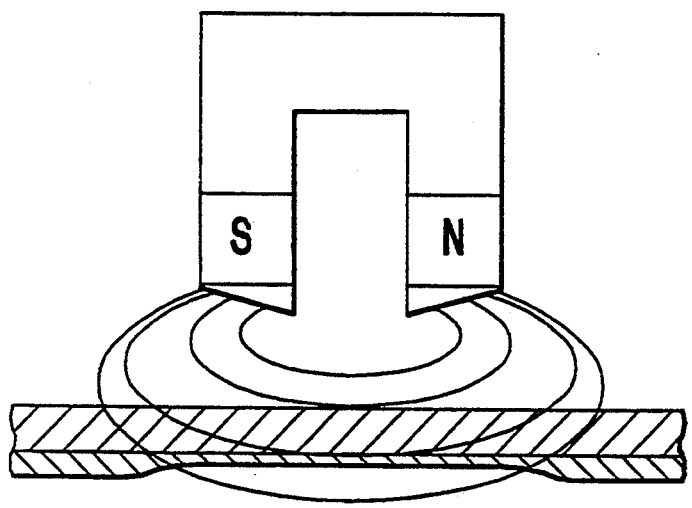
FIG. 7C is a schematic of the flux with special pole shoes fixed to the permanent magnets.

FIG. 7A illustrates the shape of the flux field without any additional fixtures, while FIG. 7B illustrates the shape of the flux field with the shunt 59 in place. FIG. 7C shows the flux field with pole shoes 70, 71 in place.

The foregoing is exemplary and not intended to limit the scope of the claims which follow.

We claim:

1. Apparatus for coating a substrate, comprising
a tubular cathode on which a tubular target is fixed, said cathode being rotatable about a central axis,
magnet means arranged inside said cathode to form an arcuate magnetic field which encloses a racetrack shaped plasma over said target, said plasma having two straight stretches parallel to said axis and two end stretches connecting said straight stretches, said magnet means being arranged to shape said magnetic field over said end stretches so that said plasma is wider in said end stretches than in said straight stretches.

2. Apparatus as in claim 1 wherein said magnet means comprises inner magnet means having one polarity facing said target, outer magnet means having another polarity facing said target, and yoke means connecting said inner and outer magnet means opposite from said target, thereby forming arcuate flux between said inner and outer magnet means.

3. Apparatus as in claim 2 wherein said inner and outer magnet means are spaced further apart where said end stretches are formed than where said straight stretches are formed.

4. Apparatus as in claim 2 wherein said magnet means comprises shunt means bridging between said yoke means and one of said inner and outer magnet means where said end stretches are formed.

5. Apparatus as in claim 2 wherein said magnet means comprises pole shoe means associated with at least one of said inner and outer magnet means where said end stretches are formed.

6. Apparatus as in claim 5 wherein said pole shoe means comprises inner pole shoe means associated with said inner magnet means and outer pole shoe means associated with said outer magnet means, said inner and outer pole shoe means having mutually opposed faces from which magnetic flux emanates.

* * * * *